United States Patent
Chang et al.

[11] Patent Number: 6,083,834
[45] Date of Patent: Jul. 4, 2000

[54] ZINCATE CATALYSIS ELECTROLESS METAL DEPOSITION FOR VIA METAL INTERCONNECTION

[75] Inventors: Jieh-Ting Chang; Yun-Hung Shen, both of Hsin-Chu; Chih-Ming Ke, Hsing-Chu, all of Taiwan

[73] Assignee: Taiwan Semiconductor Manufacturing Company, Hsin-Chu, Taiwan

[21] Appl. No.: 09/234,060

[22] Filed: Jan. 19, 1999

[51] Int. Cl.[7] ............................................. H01L 21/44
[52] U.S. Cl. .............................................................. 438/678
[58] Field of Search ................................... 438/678, 559, 438/563, 22; 250/170, 310

[56] References Cited

U.S. PATENT DOCUMENTS

| | | | |
|---|---|---|---|
| 4,235,648 | 11/1980 | Richardson | 148/6.27 |
| 4,567,066 | 1/1986 | Schultz et al. | 427/305 |
| 5,017,516 | 5/1991 | van der Putten | 427/230 |
| 5,028,454 | 7/1991 | Lytle et al. | 427/123 |
| 5,147,692 | 9/1992 | Bengston | 427/438 |
| 5,182,006 | 1/1993 | Haydu et al. | 205/310 |
| 5,308,796 | 5/1994 | Feldman et al. | 437/200 |
| 5,466,360 | 11/1995 | Ehrsam et al. | 205/170 |

*Primary Examiner*—David Nelms
*Assistant Examiner*—Dung A Le
*Attorney, Agent, or Firm*—George O. Saile; Stephen B. Ackerman; William J. Stoffel

[57] ABSTRACT

A method of forming an interconnect or metal line in a semiconductor device using an zinc activated metal surface and electroless deposition. The invention forms an active metal layer (e.g., Al) layer on an insulating layer in a via hole, activates the active metal layer to form a Zn layer, and electrolessly deposits a metal (e.g., Cu, Ni, Au, or Ag) by reacting with the Zn layer. The metal layer is electroless deposited over the insulating layer. The metal layer fills the via hole to form a metal interconnect or line. Key features of the invention are the active metal layer and the zincate process (not a zinc particle process).

13 Claims, 2 Drawing Sheets

ZINCATE CATALYSIS ELECTROLESS METAL DEPOSITION FOR VIA METAL INTERCONNECTION

BACKGROUND OF INVENTION

1) Field of the Invention

The present invention relates to electroless Metal (e.g., Copper) deposition, more particularly to the electroless copper deposition for interconnections of semiconductor devices, and still more particularly to the zinc activation of an active metal, e.g., Al or Mg surfaces for receipt of electroless Copper in a via hole for an interconnection.

2) Description of the Prior Art

In the fabrication of integrated circuits, generally multiple layers of material are formed and electrical interconnects are made between these layers. These interconnects are generally formed by etching a via or window through an intermediate layer, e.g., a dielectric layer, and filling the via with a metallic material to establish a conduction path. An electrically conductive pattern produced on the overlying layer then provides the desired electrical circuit connection to regions in the underlying layer.

At design rules less than 0.5 micron, the aspect ratio of the via or window defining the interconnects is generally greater than 3 and often as high as 5 to 10 (Aspect ratio is the ratio of height to width of the opening defining the interconnect.) For such high aspect ratios, it is often a challenge to fill the via completely with the metallization material and to assure good electrical continuity between the adjoining conducting layers. Seams and voids resulting from poor filling not only yield a high via resistance but also invite entrapment of contaminants in subsequent processing steps that, in turn, often lead to reliability problems. To avoid gaps and the attendant problems, chemical vapor deposition (CVD) procedures are typically employed. Since CVD occurs at a surface from a gas, filling of high aspect ratio interconnects is possible. However, CVD for metals such as aluminum involves many difficulties and often requires significant care. Use of directional sputtering has also been investigated but is extremely difficult to control, especially at small dimensions and high aspect ratios.

Sometimes, it is also desirable that the interconnects be filled during formation of the metal pattern on the overlying layer. In this case, pattern forming is generally accomplished by blanket deposition to fill the interconnects and to produce an overlying layer of metal, with subsequent delineation of this layer by etching through a photolithography defined mask.

Although aluminum metallization patterns together with aluminum or refractive metal interconnects have almost uniformly been employed in integrated circuit devices for strict design rules, i.e., less than 0.5 micron, at such design rules the time delay in the circuit attributed to the delay in the interconnects becomes a significant factor. To reduce this delay, use of copper with its lower electrical resistivity has been proposed. (The specific resistivity of pure copper is 1.7 micro-ohm-cm, that for aluminum is 2.8, and 3.3 is typical for copper-containing aluminum alloys presently used for VLSI metallization.) Metallization with a copper material, i.e., a material of at least 90 mole percent copper also offers other advantages. With smaller device dimensions, concomitant current density increase in the narrowed aluminum conductors often engenders reliability problems due to electromigration, i.e. distortion of the lines in the pattern. Copper appears to be less susceptible to such problems.

However, implementation of copper metallization for submicron device fabrication has been extremely difficult. Copper has a tendency to diffuse into silicon and silicon dioxide. The adhesion of copper is known to be notoriously poor. It is also extremely difficult to etch copper to produce desired fine line (0.5 $\mu$m or finer) circuit patterns. Comparable procedures such as chemical vapor deposition for depositing copper suffer many complications relating to selectivity and processing temperatures. Therefore, although use of copper in the metallization of integrated circuits might be theoretically desirable for shrinking design rules, suitable means are still lacking.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,028,454 (Lytle) : Electroless plating of portions of semiconductor devices and the like—that shows a zincate process for electroless Al deposition.

U.S. Pat. No. 5,017,516 (Van der Putten) shows a Pd nucleating layer for electroless dep.

U.S. Pat. No. 4,567,066 (Schultz)—Electroless nickel-plating of aluminum teaches a process for improving the electroless nickel plating of aluminum which has been pretreated with a barrier coating such as zinc by employing multiple plating baths under controlled operating conditions.

U.S. Pat. No. 5,147,692(Bengston): Electroless plating of nickel onto surfaces such as copper or fused tungsten— Conductive surfaces such as copper and/or tungsten surfaces, particularly copper circuitry areas of printed circuit board substrates or fused tungsten circuitry areas of fused tungsten-ceramic packages, are activated for receipt of electroless nickel plating thereon by providing the surfaces with particulate zinc metal, particularly by contact of the surfaces with an aqueous suspension of particulate zinc metal. However, this process suffers from Zn particles issues when used in VLSI and USLI applications.

U.S. Pat. No. 5,308,796 (Feldman) shows a method of selective electroless deposition for an interconnect.

SUMMARY OF THE INVENTION

It is the primary object of the present invention to provide a process for depositing an electroless metal (e.g., Copper, Ni, Au) layer onto a novel active metal (e.g., Al or Mg) surfaces, particularly in a via hole in an insulating layer for integrated circuits.

Another object of the invention is to effect the electroless Copper deposition to form interconnects for semiconductor devices without need for expensive activators for the surfaces.

These and other objects are achieved by means of a process in which the active metal (Al or Mg surfaces) 50 is formed over a semiconductor structure. The active metal is contacted with a composition comprised of Zinc ion in a liquid carrier, so as to activate the surfaces for the subsequent electroless metal (e.g., Cu, Ni or Au) deposition. Activation is achieved without need for palladium-based catalysts. Next, metal (e.g., Cu, Ni or Au) is electrolessly plated using the Zn layer 52 as a catalyst and a metal layer 60 is formed.

To accomplish the above objectives, the present invention provides a method of forming an interconnect or metal lines in a semiconductor device. The invention ⑥ forms an active metal (e.g., Al) layer 50 in a via hole 30, ② activates the active metal with Zn 52 to form a Zn layer 52 and ③ electrolessly deposits metal (e.g., Cu, Ni or Au) in the via hole to form a metal line. A key feature of the invention is the active metal layer 50.

The active metal layer 50 improves the electroless deposition process by depositing the active metal 50 to reduce the $Zn^{2+}$ (ion) for the Zn metal layer 52. The Zn metal layer 52 will activate/catalyze the electroless metal deposition (layer 60).

This patent teaches how to catalysis the electroless metal deposition 60 (Cu, Ni, Au, etc.) on an active metal 40 in via hole 30 by Zincate process. Main points of invention are: 1. An active metal must be deposited before Zincate process as an oxidizing agent. 2. A suitable acid dip to clean active metal 50 before Zincate process. 3. Alkali Zincate solution contains Zinc ion (not particles) to replace active metal in via hole as catalysis. 4.Electroless metal 60 replaces Zinc 52 and is deposited in via hole.

Benefits

Among the significant advantages of the invention is the ability to activate active metal (Al or Mg) surfaces for subsequent electroless metal (e.g., Cu, Ni or Au) deposition utilizing relatively low cost Zincate compositions which do not require the attention to controlled concentrations of components as is the case for palladium-based activators and boron-based prestrike activators. Also, the invention's zincate solution (not Zn particle solution) is cheaper than Palladium solutions and more stable than Palladium solution for improved process control.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
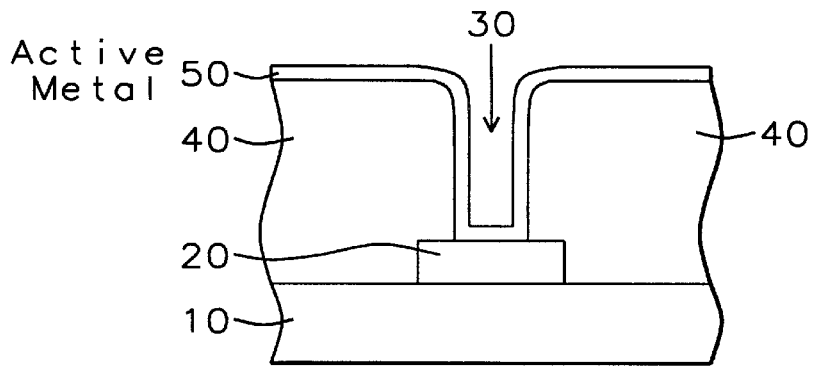
FIGS. 1, 2, 3, and 4 are cross sectional views for illustrating a method for electroless depositing metal into a submicron via hole to form a metal line or interconnect.

The present invention will be described in detail with reference to the accompanying drawings. The present invention provides a method of forming an interconnect or metal lines in a semiconductor device. The invention has 3 key deposition steps:

1) forming an active metal (e.g., Al) layer in a via hole.

2) (See FIGS. 2 & 5A) immersing the device in a zincated solution 53 to reduce the active metal ($M_{active}$) with the Zn ions from a zincate solution thereby consuming some or all of the active metal layer 50 and to deposit a Zn metal layer 52.

3) (See FIGS. 3 and 5C) A metal is electrolessly deposited, using an electroless solution 61, on the Zn layer 52 to form a metal line 60 interconnect 60.

Figure 4:
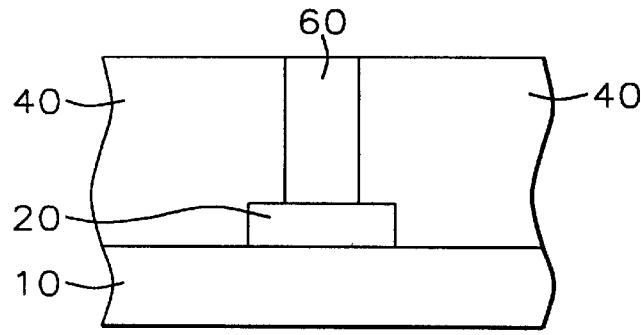

Afterward, the metal layer can be planarized (See FIG. 4). A key feature of the invention is the active metal layer 50.

The fundamental objective of the inventive process, as applied to its preferred aspects, is to deposit zinc metal 52 onto active metal (Al or Mg) surfaces so as to activate those surfaces to subsequent electroless metal (e.g., Cu, Ni or Au) depositing.

TABLE 1

Summary of process

| FIG. | Step |
|---|---|
| 1 | providing a via hole 30 in an insulating layer 40 over a metal layer 20 |
| 1 | deposit an active metal 50 (such as Al, Mg) over the first insulating layer 40 and the exposed metal layer 20 |
| 2 | performing a zincate process on the active metal 50 to consume part or all of the active metal and to form a zinc metal layer 52 over the insulating layer 40 |
| 3 | electrolessly deposit a first metal (e.g., Cu, Ni or Au) 60 over insulating layer 40 to fill the via hole 30 and to form an interconnect 60. |

Figure 2:
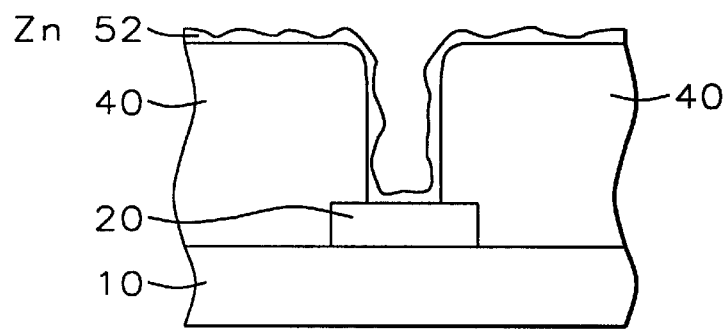
Figure 5A:
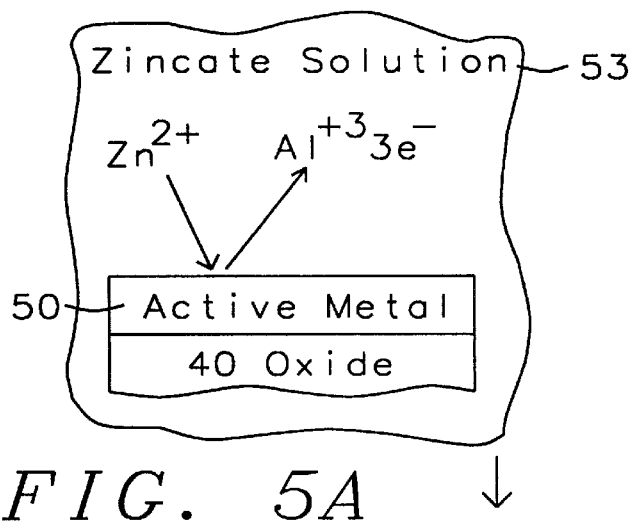
FIGS. 5A, 5B, 5C and 5D are cross sectional views for illustrating a method and chemical reactions for electroless depositing metal into a submicron via hole to form a metal line or interconnect.

The inventions Zincate process can be summarized by the following chemical reactions:

(1) $Zn^{2+} + M_{(active\ metal)} \rightarrow Zn\ (s)\ (layer\ 52) + M^{n+}_{(active\ metal\ ion)}$ (See FIGS. 2 & 5A)

Figure 3:
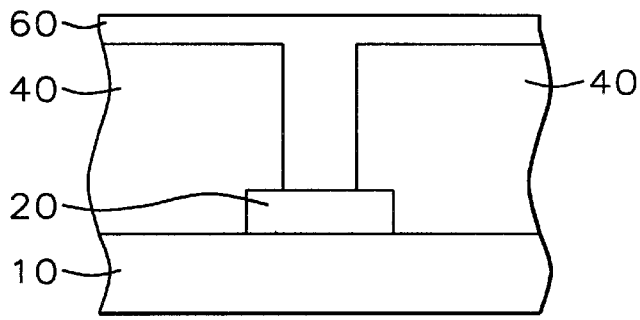
Figure 5B:
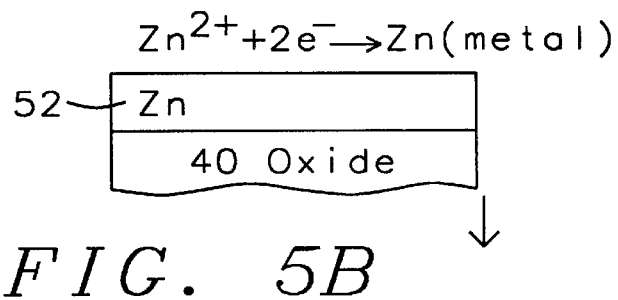
Figure 5C:
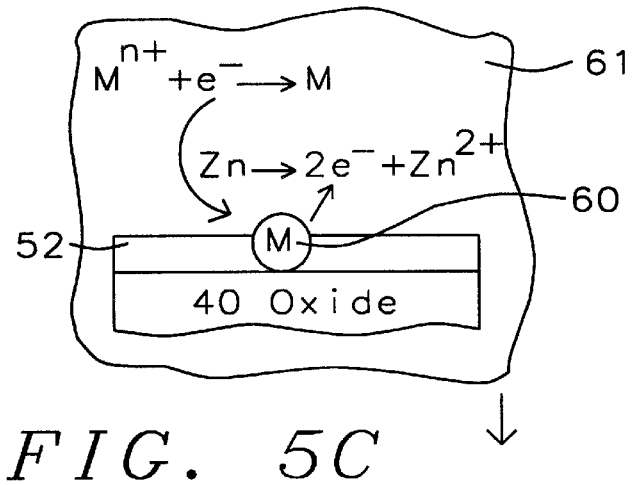

(2) $Zn\ (s) + M^{n+}_{(electroless\ metal\ ion)} \rightarrow M\ (s)_{(electroless\ metal)}$ (layer 60) $+ Zn^{2+}$ (See FIGS. 3 and 5C)

A key feature of the invention is the active metal 50. The active metal 50 activates zinc reduction to form the zinc layer 52.

The invention's process contrasts with a conventional electroless deposition as shown below:

(3) $Pd^{2+} + M^{n+}$ (electroless metal ion) $\rightarrow Pd^{4+} + M\ (s)$ (electroless metal)

Compared to the invention's active metal/Zincate process, the conventional metal has the disadvantages of high cost, and need tighter process control.

As shown in FIG. 1 a via hole 30 is formed in an insulating layer 40 over a semiconductor structure 10. The semiconductor structure is understood to possibly include a semiconductor wafer, active and passive devices formed within the wafer and layers formed on the wafer surface. The term "structure" is mean to include devices formed within a semiconductor wafer and the layers overlying the wafer.

The via hole exposes a metal layer 20 (e.g., metal line or metal interconnect or metal contact). The via hole is defined by sidewalls 30 of the insulating layer in the via hole 14 and on the bottom by the semiconductor structure (e.g., metal line). It will be appreciated that the metal fine 20 is optional.

The insulating layer is preferably composed of silicon oxide. The via hole 30 preferably has a diameter in a range of between about 0.15 and 1.0 $\mu$m.

Depositing the Active Metal 52

FIG. 1 shows the step of depositing an active metal over the first insulating layer 40 and the exposed metal layer 20. The "active metal" 50 must have a electrochemical potential lower than Zn. The active metal can be Al, Mg, or any metal with a electrochemical potential lower than Zn; and is most preferably aluminum (Al). The active metal preferably has a thickness in a range of between about 200 and 1000 Å.

The active metal important because it lines the sidewall of the via hole to allow both horizontal and vertical Cu electroless deposition to fill the via hole.

Next, in an optional step, but preferred, the active metal is treated with an acid dip to remove a native oxide (e.g., $Al_2O_3$ or MgO) over the active metal. This step is not required if a strong alkali zincate bath is used in the next step.

FIG. 2 shows the step of performing a zincate process on the active metal to form a uniform zinc metal layer 52 (not a particle layer) over any remaining layer 50 and over the insulating layer 40 and metal layer 20. Also see FIG. 5A.

The zincate process comprises contacting the active metal layer with a composition comprising zinc metal ions in a carrier liquid, whereby the zinc metal is thereby caused to be present on the active metal surface. The zincate solution preferably comprises ZnO, KOH, NaOH $NaHCO_3$ and $H_2O$.

Next, preferably the active metal with Zn is rinsed with DI water.

Electroless Depositing A Metal 60

FIG. 3 shows the step of electroless depositing a first metal 60 (Cu, Ni, Au, etc.) over the Zn metal layer 52 to fill the via hole.

The deposited metal 60 can be Cu, Ni, Au, or Ag and is most preferably Cu.

The electroless Cu process can be performed using a standard commercial process.

The article, Simulation of Electroless Deposition of Cu Thin Films For Very large Scale Integration Metallization, by T. Smy et al., J. Electrochem. Soc., Vol. 144, No.6, June 1997, pp. 2115 to 2122, describes methods and models for Cu electroless deposition into small submicron via holes.

Next, the electrolessly deposited metal layer 60 is preferably planarized by a chemical-mechanical polish or an etch back process to remove the metal 60 from over the top surface of the insulating layer 40. It should be noted that the metal 60 can form an interconnect or a metal line (not over an underlying metal line 20).

Chemical Reactions

FIGS. 5A, 5B, 5C and 5D show the deposition steps and chemical reactions for the major steps of the invention. FIG. 5A shows the deposition of the Zn layer 52 using a Zinated solution 53 on the active metal layer 50. The chemical reaction is also shown.

FIG. 5B show the final stage of the Zn layer 52 deposition.

FIG 5C shows the deposition of the electroless metal 60 using an electroless solution 61. The chemical reaction is also shown.

Figure 5D:
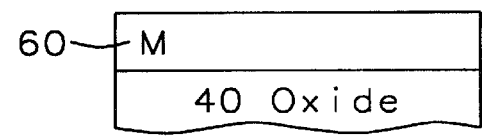

FIG 5D shows the final stage of the electroless metal 60 over the insulating layer 40 (e.g. oxide) or Aluminum layer.

This patent teaches how to catalysis the electroless metal deposition 60 (Cu, Ni, Au, etc.) on an active metal 40 in via hole 30 by Zincate process. Main points of invention are: 1. An active metal must be deposited before Zincate process as an oxidizing agent. 2. A suitable acid dip to clean active metal 50 before Zincate process. 3. Alkali Zincate solution contains Zinc ion (not particles) to replace active metal in via hole as catalysis. 4. Electroless metal 60 replaces Zinc 52 and is deposited in via hole.

Among the significant advantages of the invention is the ability to activate active metal (Al or Mg) surfaces for subsequent electroless Copper deposition utilizing relatively low cost Zincate compositions which do not require the attention to controlled concentrations of components as is the case for palladium-based activators and boron-based prestrike activators. Also, the invention's zincate solution is cheaper than Palladium solutions and more stable than Palladium solution for improved process control.

The element numbers in the summary of the invention and detail description of the invention do not limit the invention in any way. The element number and FIGS merely aid in the understanding of the invention and show specific embodiments. The invention can be used in other configurations in semiconductor devices and other applications not explicitly shown are possible.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of electroless deposition using an active metal that is reacted with Zn to form a metal line in a semiconductor device, comprising the steps of:
   a) providing an insulating layer over a semiconductor structure;
   b) depositing an active metal layer over said insulating layer and said semiconductor structure;
   c) performing a zincate process on said active metal layer to consume a portion of said active metal layer and to form a zinc layer over said insulating layer d) electrolessly depositing a metal layer over said semiconductor structure thereby consuming at least a portion of said zinc layer.

2. The method of claim 1 wherein said via hole exposing a metal layer that is a top surface of said semiconductor structure.

3. The method of claim 1 wherein said insulating layer is composed of silicon oxide.

4. The method of claim 1 wherein after step (b) and before step (c) treating said active metal layer with an acid dip to remove a native oxide over said active metal layer.

5. The method of claim 1 wherein the zincate process comprises immersing said active metal layer in a zincate bath composed of: ZnO, KOH, NaOH, $NaHCO_3$ and $H_2O$.

6. The method of claim 1 wherein after step (b) and before step (c) rinsing said active metal layer with DI (deionized) water.

7. The method of claim 1 wherein said active metal layer is Al, Mg, or a metal with a lower electrochemical potential than Zn.

8. The method of claim 1 wherein said active metal layer has a thickness in a range of between about 200 and 1000 Å.

9. The method of claim 1 wherein said metal layer is composed of a material selected from the group consisting of Cu, Ni, Au, and Ag.

10. The method of claim 1 which further includes: planarizing said metal layer using an etch back process to form a metal line of said semiconductor device.

11. A method of electroless deposition using an active metal that is reacted with Zn to form a metal line in a semiconductor device, comprising the steps of:
   a) providing a via hole in an insulating layer over a semiconductor structure; said via hole exposing a metal contact that is a top surface of said semiconductor structure; said via hole defined by sidewalls of said insulating layer and said metal contact;
   b) treating said active metal layer with an acid dip to remove a native oxide over said active metal layer;
   c) depositing an active metal layer over said first insulating layer and said exposed metal contact; said active metal layer is composed of a material selected from the group consisting of Al, Mg, and a metal with a lower electrochemical potential than Zn;
   d) rinsing said active metal layer with DI (deionized) water;
   e) performing a zincate process on said active metal layer to consume a portion of said active metal layer and to form a zinc layer over said insulating layer; said zincate process comprises immersing said active metal layer in a zincate bath composed of: ZnO, KOH NaOH, $NaHCO_3$ and $H_2O$;
   f) electroless depositing a metal layer over said insulating layer to fill said via hole and to at least partially consume said zinc layer; said metal is composed of a material selected from the group consisting of Cu, Ni, Au, and Ag;
   g) planarizing said metal layer using an etch back process to form a metal line of said semiconductor device.

12. The method of claim 11 wherein said insulating layer is composed of silicon oxide, and said via hole having a diameter in a range of between about 0.15 and 1.0 $\mu$m.

13. The method of claim 11 wherein said active metal layer has a thickness in a range of between about 200 and 1000 Å.

* * * * *